United States Patent
McPartland et al.

(10) Patent No.: US 6,512,700 B1
(45) Date of Patent: Jan. 28, 2003

(54) NON-VOLATILE MEMORY CELL HAVING CHANNEL INITIATED SECONDARY ELECTRON INJECTION PROGRAMMING MECHANISM

(75) Inventors: Richard Joseph McPartland, Nazareth, PA (US); Ranbir Singh, Orlando, FL (US)

(73) Assignee: Agere Systems Inc., Allentown, PA (US)

( * ) Notice: Subject to any disclaimer, the term of this patent is extended or adjusted under 35 U.S.C. 154(b) by 0 days.

(21) Appl. No.: 09/956,646

(22) Filed: Sep. 20, 2001

(51) Int. Cl.$^7$ .................. G11C 16/04; H01L 29/788
(52) U.S. Cl. ...................... 365/185.28; 365/185.1; 365/185.05; 257/316; 257/320
(58) Field of Search .................. 365/185.1, 185.05, 365/185.28, 185.33; 257/316, 320, 322

(56) References Cited

U.S. PATENT DOCUMENTS

| | | | |
|---|---|---|---|
| 5,465,231 A | | 11/1995 | Ohsaki et al. |
| 5,640,346 A | * | 6/1997 | Preslar ..................... 365/185.1 |
| 5,659,504 A | | 8/1997 | Bude et al. |
| 5,838,617 A | | 11/1998 | Bude et al. |
| 6,002,610 A | | 12/1999 | Cong et al. |
| 6,011,722 A | | 1/2000 | Bude et al. |
| 6,191,980 B1 | | 2/2001 | Kelley et al. |
| 6,222,764 B1 | * | 4/2001 | Kelley et al. .......... 365/185.07 |

OTHER PUBLICATIONS

U.S. patent application Ser. No. 09/910,980, McPartland et al., filed Jul. 23, 2001.
U.S. patent application Ser. No. 09/567,521, McPartland et al., filed May 9, 2000.
R.J. McPartland et al., "SRAM Embedded Memory with Low Cost, Flash EEPROM–Switch–Controlled Redundancy," Proceedings of the IEEE Custom Integrated Circuits Conference, Orlando, Florida, May 21–24, 2000, pp. 287–289.
R.J. McPartland et al., "1.25 Volt, Low Cost, Embedded Flash Memory for Low Density Applications," Proceedings of the 2000 Symposium on VLSI Circuits, Honolulu, Hawaii, Jun. 15–17, 2000, pp. 158–161.
J.D. Bude et al., "Secondary Electron Flash—A High Performance, Low Power Flash Technology for 0.35 μm and Below," IEEE, IEDM, pp. 279–282, 1997.

* cited by examiner

*Primary Examiner*—Son Mai
(74) *Attorney, Agent, or Firm*—Ryan, Mason & Lewis, LLP

(57) ABSTRACT

A non-volatile memory cell and associated cell array and memory device having reduced program disturb, improved retention of programmed information, and reduced power consumption are disclosed. The memory cell includes a control device coupled to a switch device via a common floating gate, with the control device and the switch device formed on a common substrate, and the switch device formed at least in part in a tub region on the substrate. The tub region has a contact region formed therein. The contact region is adapted for application of a bias voltage to the tub region during a programming operation of the memory cell so as to reduce a programming voltage required to program the memory cell. In an illustrative embodiment, a drain-to-substrate voltage required to program the memory cell is reduced from a conventional value of about 6.5 volts to a value of about 3.5 volts, thus alleviating program disturb problems that can result, e.g., when the drain-to-substrate voltage is applied to multiple columns of an array of cells that are programmed one row at a time. The memory cell is programmed by channel initiated secondary electron (CHISEL) injection of charge onto the floating gate. The invention is particularly well suited for implementation in single-poly flash EEPROM embedded memory devices in integrated circuit applications.

18 Claims, 3 Drawing Sheets

NON-VOLATILE MEMORY CELL HAVING CHANNEL INITIATED SECONDARY ELECTRON INJECTION PROGRAMMING MECHANISM

FIELD OF THE INVENTION

The present invention relates generally to electronic memory devices, and more particularly to non-volatile memory cells for use in electronic memory devices such as electrically erasable programmable read-only memories (EEPROMs).

BACKGROUND OF THE INVENTION

A non-volatile memory device is capable of retaining stored information after disconnection of its power source. An EEPROM is a type of non-volatile memory device in which information is written to and erased from the memory cells thereof using an electrical signal. EEPROMs are often implemented as "flash" memory devices in which all memory cells or designated sectors of cells can be simultaneously erased. Such devices typically utilize floating gate transistor structures in which the floating gate used to store charge upon programming of the cell is formed from a single layer of polysilicon. These single-poly flash EEPROMs are particularly well suited for use in applications requiring embedded, low cost, medium density arrays of non-volatile memory cells, such as parameter, protocol, code and data storage for processors and other types of integrated circuits.

Examples of single-poly flash EEPROM memory cells known in the art are described in U.S. Pat. No. 5,465,231, issued Nov. 7, 1995 in the name of inventor K. Ohsaki and entitled "EEPROM and Logic LSI Chip Including Such EEPROM," U.S. Pat. No. 6,191,980, issued Feb. 20, 2001 in the name of inventors P. J. Kelley et al. and entitled "Single-Poly Non-Volatile Memory Cell Having Low-Capacitance Erase Gate," R. J. McPartland et al., "SRAM Embedded Memory with Low Cost, FLASH EEPROM-Switch-Controlled Redundancy," Proceedings of the IEEE Custom Integrated Circuits Conference, Orlando, Fla., May 21–24, 2000, pp.287–289, and R. J. McPartland and R. Singh, "1.25 Volt, Low Cost, Embedded FLASH Memory for Low Density Applications," Proceedings of the 2000 Symposium on VLSI Circuits, Honolulu, Hawaii, Jun. 15–17, 2000, pp. 158–161, all of which are incorporated by reference herein.

FIG. 1 shows a side sectional view of a portion of a conventional single-poly flash EEPROM memory cell 100 of a type similar to that described in the above-cited U.S. Pat. No. 5,465,231. A corresponding schematic diagram is shown in FIG. 2. The memory cell 100 as shown includes a control device M1 and a switch device M2. M1 is implemented as a P-type metal oxide semiconductor (PMOS) device, and M2 is implemented as an N-type MOS (NMOS) device. More particularly, the cell 100 includes a P-type substrate 102 coupled to a substrate voltage (VSUB) terminal 103 and having an N-tub 104. The N-tub 104 is also commonly referred to as an N-well. The control device MI is formed within the N-tub 104 using P+ source/drain regions 106, 108 and N+ "tub tie" or contact region 110, each coupled to a control gate terminal 111. The switch device M2 includes N+ regions 112 and 114 formed in the substrate 102 and coupled to respective source and drain terminals 113 and 115. The control device MI and switch device M2 share a common polysilicon floating gate 120 designed to retain charge after the cell is written, i.e., programmed.

The memory cell 100 is programmed using a channel hot electron (CHE) programming technique, also known as hot electron injection. This technique involves applying a high gate-to-substrate voltage VGS and a high drain-to-substrate voltage VDS to the respective control gate terminal 111 and drain terminal 115 while setting voltage VS of the source terminal 113 and voltage VSUB of the substrate 102 to 0 volts. Typical values for the programming voltages VGS and VDS are 7 volts and 6.5 volts, respectively, as indicated in the FIG. 2 schematic diagram. The heavy source-to-drain electron conduction resulting from these applied voltages generates hot electrons that jump a gate oxide barrier layer (not shown) and land on the polysilicon floating gate 120. This effectively increases the threshold voltage of the switch device M2, thereby programming the memory cell. More specifically, the potential of the floating gate 120 is lowered by the above-noted hot electron injection such that when the floating gate is coupled to the control gate terminal 111 during a subsequent read operation, the potential of the floating gate will be below the threshold of the switch device M2 and M2 will thereby be non-conductive.

Erasure of a programmed cell involves removing electrons from the floating gate 120 so as to increase the potential of the floating gate and thereby lower the effective threshold voltage of the switch device M2. This may involve raising the drain-to-substrate voltage VDS applied to drain terminal 115 to a value near the drain-to-substrate junction breakdown voltage, so as to generate hot holes that are swept, via the drain-to-gate electric field, through the above-noted oxide barrier layer to the floating gate 120. This is equivalent to removing electrons from the floating gate. The object of this erase operation is to raise the potential of the floating gate 120 such that when the floating gate is coupled to the control gate terminal 111 during a subsequent read operation, the potential of the floating gate will be above the threshold of the switch device M2 and M2 will thereby be conductive.

A typical conventional EEPROM or other memory device will generally be configured as an array of memory cells arranged in rows and columns. In an array of cells of the type described in conjunction with FIGS. 1 and 2 above, the above-noted typical VDS programming voltage of 6.5 volts is simultaneously applied to the drain terminals of multiple columns of cells, but the cells are programmed only a single selected row at time by raising the control gate voltage VGS of the selected row to the typical programming voltage of 7 volts. Cells in the non-selected rows see the high drain voltage VDS but not the high control gate voltage VGS, and should not be programmed or erased.

Although such an arrangement may be acceptable in certain older generations of CMOS technologies, the lower drain-to-substrate junction breakdown voltages associated with the more aggressive modem CMOS technologies can lead to significant problems in terms of undesired erasure, also referred to herein as "program disturb." For example, the high drain voltage VDS applied to multiple columns of the memory cell array is sufficiently close to the approximately 7 volt drain-to-substrate breakdown voltage associated with modem CMOS technologies that hot holes may be inadvertently generated in the cells of non-selected rows and information thereby erased from those cells. This undesired hot hole erasure can also damage the oxide barrier layer, resulting in a degradation in the ability of the cells to retain programmed information, also referred to herein as their information retention or endurance. The higher programming voltages required also unduly increase the power consumption of the devices.

As is apparent from the foregoing, a need exists in the art for a non-volatile memory cell and associated cell array and memory device having a programming mechanism which alleviates the program disturb problem while also improving cell information retention.

SUMMARY OF THE INVENTION

The present invention provides an improved non-volatile memory cell and associated cell array and memory device that in an illustrative embodiment can be configured to substantially eliminate the program disturb problem, while also significantly improving information retention and reducing power consumption relative to conventional devices.

In accordance with one aspect of the invention, a non-volatile memory cell is configured so as to utilize a channel initiated secondary electron (CHISEL) injection programming mechanism. The memory cell includes a control device coupled to a switch device via a common floating gate, with the control device and the switch device formed on a common substrate, and the switch device formed at least in part in a tub region on the substrate. The tub region has a contact region formed therein. The contact region is adapted for application of a bias voltage to the tub region during a programming operation of the memory cell so as to reduce a programming voltage required to program the memory cell.

In an illustrative embodiment, the bias voltage may be on the order of approximately −2.0 volts. Through application of this bias voltage, a drain-to-substrate voltage required to program the memory cell is reduced from a conventional value of about 6.5 volts to a value of about 3.5 volts. This alleviates program disturb problems that can result, e.g., when the drain-to-substrate voltage is applied to multiple columns of an array of cells that are programmed one row at a time, and also prevents the above-noted damage to the oxide barrier layer.

In accordance with another aspect of the invention, the switch device is formed in a first tub region of a first conductivity type, e.g., the same conductivity type as the substrate, and the first tub region is itself formed in a second tub region of a second conductivity type. The contact region formed in the first tub region is of the first conductivity type, and is adapted for application of a voltage to the first tub region during the programming operation of the memory cell. The second tub region may also have a contact region formed therein, with that contact region being adapted for application of a voltage to the second tub region. The latter applied voltage may be on the order of 0 volts or ground potential, such that the junction formed between the first tub region and the second tub region is in a reverse bias state.

In addition to the advantages of reduced program disturb and improved retention, a non-volatile memory device in accordance with the invention can be operated using lower programming voltages than conventional devices, and thus requires less power.

The invention is particularly well suited for implementation in single-poly flash EEPROM embedded memory devices in integrated circuit applications, but can also be used in other applications.

DETAILED DESCRIPTION OF THE INVENTION

The present invention will be illustrated herein using exemplary non-volatile memory cell circuits implemented using complementary metal oxide semiconductor (CMOS) circuit structures. It should be understood, however, that the invention is suitable for use with circuit structures other than those specifically described herein. For example, those skilled in the art will recognize that the conductivity types of the devices in a given circuit generally may be reversed, e.g., P-type devices may be replaced with N-type devices and vice versa. These and other modifications to the illustrative embodiments will be apparent to those skilled in the art.

Figure 1:
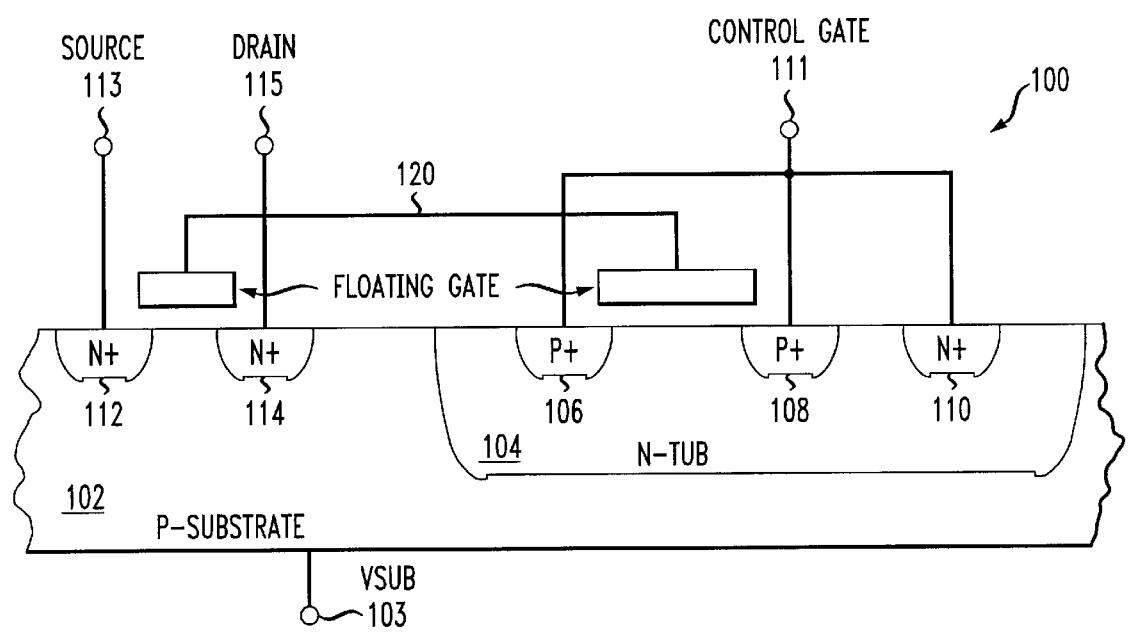
FIG. 1 is a side sectional view of a conventional non-volatile flash EEPROM memory cell.
Figure 2:
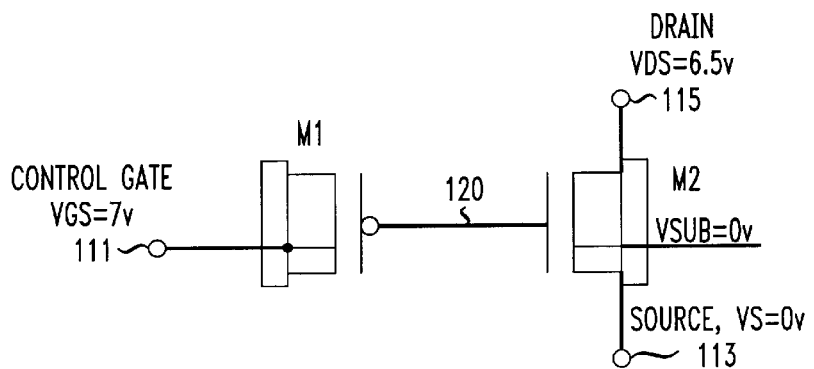
FIG. 2 is a schematic diagram of the conventional memory cell of FIG. 1.

As described in detail above, the configuration of conventional memory cells such as cell 100 of FIGS. 1 and 2 can lead to program disturb and information retention problems, e.g., when the cells are implemented using modem CMOS technologies having drain-to-substrate breakdown voltages on the order of about 7 volts.

The present invention overcomes these and other problems of the prior art by providing an improved non-volatile memory cell in which the drain-to-substrate voltage VDS applied during programming of the cell can be significantly reduced.

The invention in an illustrative embodiment to be described herein uses a channel initiated secondary electron (CHISEL) programming mechanism in place of the conventional channel hot electron (CHE) programming mechanism previously described in conjunction with the memory cell 100 of FIGS. 1 and 2. Advantageously, a memory cell in accordance with the invention can be programmed using a lower drain-to-substrate voltage VDS, such that undesired erasure during programming is avoided, and retention of programmed information is enhanced.

Figure 3:
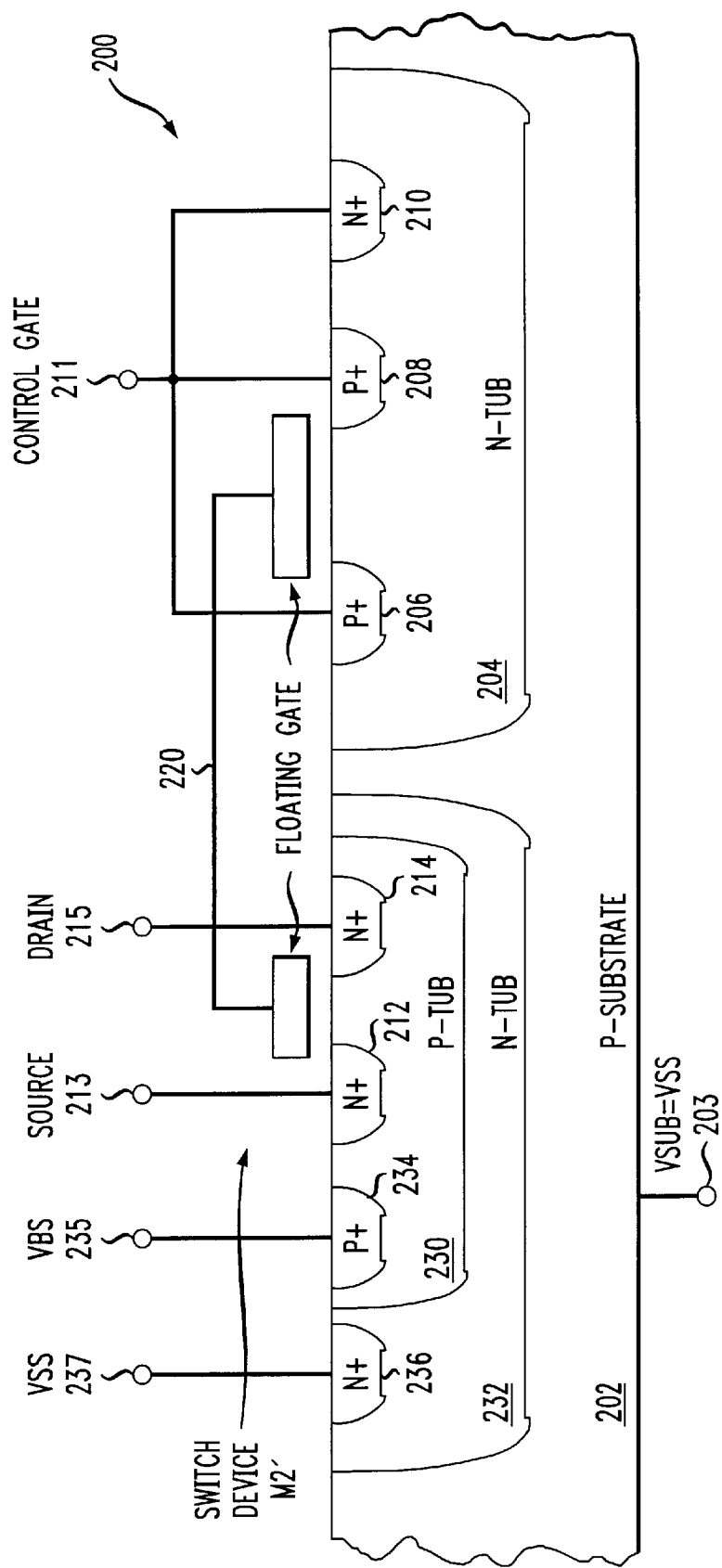
FIG. 3 is a side sectional view of a non-volatile flash EEPROM memory cell in accordance with an illustrative embodiment of the invention.
Figure 4:
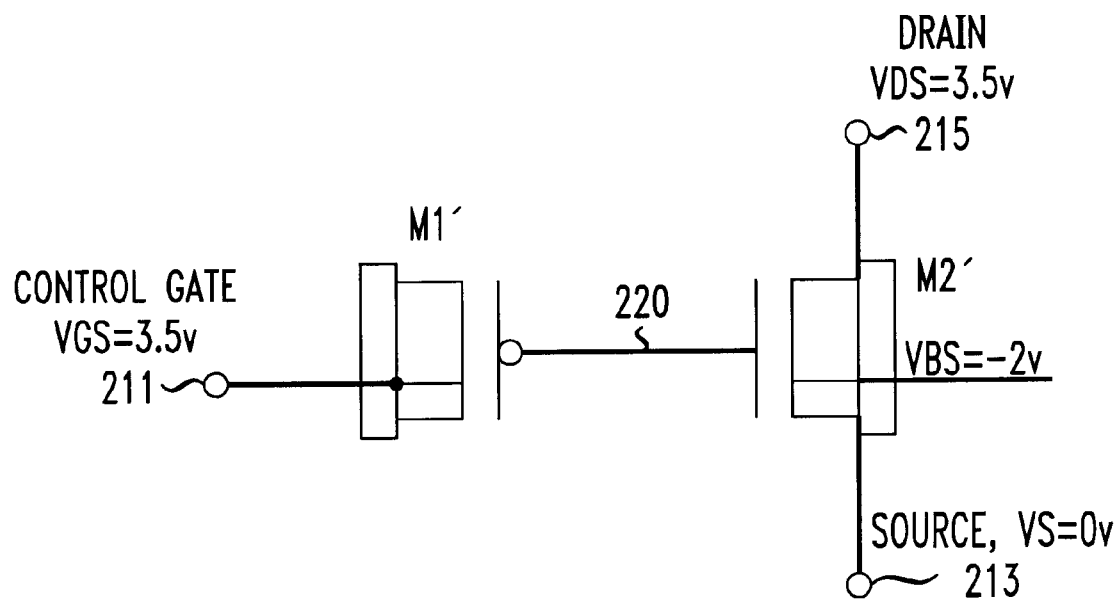
FIG. 4 is a schematic diagram of the conventional memory cell of FIG. 3.

FIG. 3 shows a side sectional view of a portion of a memory cell 200 in accordance with the illustrative embodiment of the invention. A corresponding schematic diagram is shown in FIG. 4. The memory cell 200 is well suited for implementation as a single-poly flash EEPROM memory cell, but can also be implemented in other configurations, as will be readily apparent to those skilled in the art. The memory cell 200 as shown includes a control device M1' and a switch device M2'. In this embodiment, M1' is implemented as a P-type metal oxide semiconductor (PMOS) device, and M2' is implemented as an N-type MOS (NMOS) device, although as noted previously this is by way of example only.

The cell 200 includes a P-type substrate 202 coupled to a substrate voltage (VSUB) terminal 203 and having a first N-tub 204. The control device M1' is formed within the N-tub 204 using P+source/drain regions 206, 208 and N+"tub tie" or contact region 210, each coupled to a control gate terminal 211. The switch device M2' includes N+ regions 212 and 214 coupled to respective source and drain terminals 213 and 215. The control device M1' and switch device M2' share a common polysilicon floating gate 220 designed to retain charge after the cell is programmed.

As is well known, a memory cell floating gate such as floating gate 220 is typically separated from an upper surface of the semiconductor regions of the cell by an oxide barrier layer. For simplicity and clarity of illustration, this layer is not explicitly shown in the figures, but can be implemented in a conventional manner.

In accordance with the invention, the N+ regions 212, 214 of the switch device M2' are formed in a P-tub 230 that is itself formed in a second N-tub 232 of the P-type substrate 202. The P-tub 230 comprises a contacted P-tub that includes a P+ region 234 coupled to a contact terminal 235. This arrangement of contacted P-tub 230 within N-tub 232 allows application of a negative backgate-to-source voltage VBS to the P-tub 230 via terminal 235. The N-tub 232 is contacted via an N+ region 236 to a terminal 237.

As indicated above, the memory cell 200 utilizes a CHISEL programming mechanism in place of a conventional CHE programming mechanism. In accordance with this CHISEL mechanism of the present invention, and as indicated in the schematic diagram of FIG. 4, the memory cell 200 in the illustrative embodiment is programmed by applying a gate-to-substrate voltage VGS of about 3.5 volts to the control gate terminal 211 of the control device M1', a drain-to-substrate voltage VDS of about 3.5 volts to the drain terminal 215 of the switch device M2', and a backgate-to-source voltage VBS of about −2.0 volts to the P-tub 230 via P+ region 234 and terminal 235, while setting voltage VS of the source terminal 213 and voltage VSUB of the substrate 202 to VSS, typically 0 volts. VSS is also applied to N-tub 232 via N+ region 236 and terminal 237, such that the junction formed between the P-tub 230 and the N-tub 232 is in a reverse bias state. It should be understood that these and other programming voltage values referred to herein are by way of example only, and other values suitable for providing the desired CHISEL programming effect can be used in the illustrative embodiment or in other embodiments of the invention, as will be apparent to those skilled in the art.

The above-noted example applied programming voltages cause CHISEL injection to occur in the memory cell 200, rather than hot electron injection. This effectively increases the threshold voltage of the switch device M2', thereby programming the memory cell 200. More specifically, the potential of the floating gate 220 is lowered by the above-noted CHISEL injection such that when the floating gate is coupled to the control gate terminal 211 during a subsequent read operation, the potential of the floating gate will be below the threshold of the switch device M2' and M2' will thereby be non-conductive.

The drain-to-tub voltage using the example programming voltage values is about 5.5 volts (VDS−VBS =3.5 volts−(−2.0 volts)=5.5 volts), which is about 1 volt less than the typical VDS value in the conventional CHE programming arrangement of FIGS. 1 and 2. This significant reduction in the applied drain junction voltage prevents drain junction breakdown and consequently the generation of hot holes that could cause the erasure, thereby alleviating the above-described program disturb problem. Furthermore, the negative VBS voltage attracts hot holes generated in a cell of an non-selected row during programming to the P+ tub connection region 234, thereby reducing the likelihood that any such holes will find their way to the floating gate 220 and cause undesired erasure. Moreover, the lower programming voltages allow an array of the cells 200 to be written using significantly less power than in an array of conventional cells.

As in the conventional cell 100, erasure of a programmed cell 200 involves removing electrons from the floating gate 220 so as to increase the potential of the floating gate and thereby lower the effective threshold voltage of the switch device M2'. This may involve raising the voltage VDS applied to drain terminal 215 to a value near the drain to P-tub 230 junction breakdown voltage, so as to generate hot holes that are swept through the oxide barrier layer to the floating gate, which is equivalent to removing electrons from the floating gate. At this time, the P-tub to substrate voltage applied to the VBS terminal 235 may be approximately 0 volts. The object of an erase operation is to raise the potential of the floating gate 220 such that when the floating gate is coupled to the control gate terminal 211 during a subsequent read operation, the potential of the floating gate will be above the threshold of the switch device M2' and M2' will thereby be conductive.

Memory devices can be constructed using one or more arrays of the cells 200 configured in an otherwise conventional manner, e.g., in an array of rows and columns of cells, with multiple columns but only a single row being selected for programming at a given time. These and other conventional aspects regarding the operation of memory cells and cell arrays that may utilize a CHISEL programming mechanism in accordance with the invention are well known and will therefore not be further described herein.

Another advantage of the present invention is that it allows embedded flash memory devices to be manufactured without the need for an unduly large number of additional masking steps to configure the switch device drain region, thereby reducing product costs. Typical conventional embedded flash memory devices require about eight additional masking levels beyond those required for the core logic process. The invention allows a flash memory device to be manufactured with many fewer additional masking levels, and thus at a cost similar to that for a device utilizing only the core logic process.

As noted above, the invention can be implemented using other memory cell configurations. For example, the memory cell 200 can be modified in a straightforward manner to include an erase device having as its gate the common floating gate 220. Additional details regarding such erase devices and other memory cell configurations suitable for use in conjunction with the programming techniques of the invention are described in, e.g., U.S. patent application Ser. No. 09/567,521 filed May 9, 2000 and entitled "Low Voltage Flash EEPROM Memory Cell With Improved Data Retention," subsequently issued as U.S. Pat. No. 6,324,095, and U.S. patent application Ser. No. 09/910,980 filed Jul. 23, 2001 and entitled "Non-Volatile Memory Cell Array with Shared Erase Device," both of which are commonly assigned herewith and incorporated by reference herein.

A memory cell array in accordance with the invention, although particularly well suited for use in embedded memories for processors and other integrated circuits, can be used in a variety of other device applications, including, e.g., one-time-programmable (OTP) and few-time-programmable (FTP) applications such as redundancy control in SRAM or DRAM memory elements, security code or ID registers, switch functions, etc.

The particular embodiments of the invention as described herein are intended to be illustrative only. For example, as previously noted, different device conductivity types and circuit structures may be used in other embodiments. The structural dimensions, applied voltages and other device parameters described in conjunction with the illustrative embodiments are shown by way of example only, and should not be construed as limiting the scope of the invention in any way. Other embodiments of the invention can use different structural arrangements for implementing memory cell elements such as control devices, switch devices, erase devices and floating gates. These and numerous other alternative embodiments within the scope of the following claims will be readily apparent to those skilled in the art.

What is claimed is:

1. A non-volatile memory cell comprising:
   a control device;
   a switch device, the control device and the switch device being formed on a common substrate; and
   a floating gate, the control device being coupled to the switch device via the floating gate;
   wherein the switch device is formed at least in part in a tub region on the substrate, the tub region further having a contact region formed therein, the contact region being adapted for application of a negative bias voltage to the tub region during a programming operation of the memory cell.

2. The non-volatile memory cell of claim 1 wherein application of the bias voltage to the tub region serves to reduce a programming voltage required to program the memory cell.

3. The non-volatile memory cell of claim 1 wherein the programming voltage comprises at least one of a gate-to-substrate voltage and a drain-to-substrate voltage.

4. The non-volatile memory cell of claim 1 wherein the memory cell comprises a EEPROM memory cell.

5. The non-volatile memory cell of claim 1 wherein the memory cell comprises a flash memory cell.

6. The non-volatile memory cell of claim 1 wherein the memory cell comprises a single-poly memory cell.

7. A non-volatile memory cell comprising:
   a control device;
   a switch device, the control device and the switch device being formed on a common substrate; and
   a floating gate, the control device being coupled to the switch device via the floating gate;
   wherein the switch device is formed at least in part in a tub region on the substrate, the tub region further having a contact region formed therein, the contact region being adapted for application of a bias voltage to the tub region during a programming operation of the memory cell; and
   wherein the switch device is formed in a first tub region of a first conductivity type, the first tub region itself being formed in a second tub region of a second conductivity type.

8. The non-volatile memory cell of claim 7 wherein the substrate is of the first conductivity type.

9. The non-volatile memory cell of claim 7 wherein the contact region is of the first conductivity type.

10. The non-volatile memory cell of claim 7 wherein the second tub region further has a contact region formed therein, the contact region being adapted for application of a voltage to the second tub region during the programming operation of the memory cell.

11. The non-volatile memory cell of claim 10 wherein the voltage applied to the second tub region may be on the order of 0 volts or ground potential, such that a junction formed between the first tub region and the second tub region is in a reverse bias state.

12. The non-volatile memory cell of claim 1 wherein the bias voltage is on the order of approximately −2.0 volts.

13. A non-volatile memory cell comprising:
    a control device;
    a switch device, the control device and the switch device being formed on a common substrate; and
    a floating gate, the control device being coupled to the switch device via the floating gate;
    wherein the switch device is formed at least in part in a tub region on the substrate, the tub region further having a contact region formed therein, the contact region being adapted for application of a bias voltage to the tub region during a programming operation of the memory cell; and
    wherein the bias voltage when applied reduces a drain-to-substrate voltage required to program the memory cell to a voltage on the order of approximately 3.5 volts.

14. A non-volatile memory cell comprising:
    a control device;
    a switch device, the control device and the switch device being formed on a common substrate; and
    a floating gate, the control device being coupled to the switch device via the floating gate;
    wherein the switch device is formed at least in part in a tub region on the substrate, the tub region further having a contact region formed therein, the contact region being adapted for application of a bias voltage to the tub region during a programming operation of the memory cell; and
    wherein the bias voltage when applied reduces a gate-to-substrate voltage required to program the memory cell to a voltage on the order of approximately 3.5 volts.

15. The non-volatile memory cell of claim 1 wherein the memory cell is configured such that the programming operation of the cell is implemented by channel initiated secondary electron (CHISEL) injection of charge onto the floating gate so as to increase a threshold voltage of the switch device.

16. A non-volatile memory device comprising:
    at least one array of memory cells, each of at least a subset of the memory cells in the array comprising a control device coupled to a switch device via a common floating gate, the control device and the switch device being formed on a common substrate;
    wherein the switch device associated with a given one of the memory cells is formed at least in part in a tub region on the substrate, the tub region further having a contact region formed therein, the contact region being adapted for application of a negative bias voltage to the tub region during a programming operation of the given memory cell.

17. An integrated circuit comprising at least one non-volatile memory device, the non-volatile memory device comprising one or more arrays of memory cells, each of at least a subset of the memory cells in a given one of the arrays comprising a control device coupled to a switch device via a common floating gate, the control device and the switch device being formed on a common substrate, wherein the switch device associated with a given one of the memory cells is formed at least in part in a tub region on the substrate, the tub region further having a contact region formed therein, the contact region being adapted for application of a negative bias voltage to the tub region during a programming operation of the given memory cell.

18. A method of programming a non-volatile memory cell, the memory cell comprising a control device, a switch device and a floating gate, the control device being coupled to the switch device via the floating gate, the control device and the switch device being formed on a common substrate, the method comprising the steps of:
    applying a negative bias voltage to a contact region formed in a tub region on the substrate, the switch device being formed at least in part in the tub region, the bias voltage being applied during a programming operation of the memory cell; and applying at least one programming voltage to a terminal of the switch device during the programming operation to program the memory cell, the applied bias voltage being operative to reduce the programming voltage required to program the memory cell.

* * * * *